Nov. 27, 1962 B. T. HOWARD 3,066,052

VAPOR-SOLID DIFFUSION OF SEMICONDUCTIVE MATERIAL

Filed June 9, 1958 3 Sheets-Sheet 1

INVENTOR
B. T. HOWARD
BY George S. Indig
ATTORNEY

INVENTOR
B. T. HOWARD
BY George S. Indig
ATTORNEY

VAPOR-SOLID DIFFUSION OF SEMICONDUCTIVE MATERIAL

Filed June 9, 1958 3 Sheets-Sheet 3

INVENTOR
B. T. HOWARD
BY George S. Indig
ATTORNEY

United States Patent Office 3,066,052
Patented Nov. 27, 1962

3,066,052

VAPOR-SOLID DIFFUSION OF SEMICONDUCTIVE MATERIAL

Brian T. Howard, Morristown, N.J., assignor to Bell Telephone Laboratories, Incorporated, New York, N.Y., a corporation of New York Filed June 9, 1958, Ser. No. 740,958
11 Claims. (Cl. 148—1.5)

This invention relates to a method for introducing significant impurities into silicon, and to semiconductive devices produced by such method.

In the fabrication of semiconductive devices it is generally necessary to produce at least one rectifying junction in a body of semiconductive material. This is generally accomplished by starting with a body of semiconductive material of one conductivity type and introducing a significant impurity to convert a layer of the body to the opposite conductivity type. The requirements relating to the thickness of the converted layer and the concentration of significant impurity therein are dependent upon the particular device being fabricated, and for many types of devices both the thickness and the concentration must be controlled within vary narrow tolerances.

One of the more common processes for forming layers of converted conductivity type is vapor-solid diffusion, Such a process consists of exposing a semiconductive body to an atmosphere containing a significant impurity vapor. The process is conducted at elevated temperatures to permit the significant impurity in the vapor to enter the semiconductive body and diffuse inward at a reasonable rate thereby making possible the production of a p-n rectifying junction. The concentration of significant impurity, and to a lesser extent the depth of the diffused layer produced by vapor-solid diffusion processes, are dependent upon the vapor pressure of the significant impurity in the atmosphere in contact with the semiconductive body. That is to say, an equilibrium exists between the concentration of the significant impurity in the atmosphere and the concentration of the significant impurity in the surface portion of the semiconductive body. Thus, reproducibility of results obtained by use of this prior art process depends, in large measure, on the ability to uniformly control the vapor pressure of the significant impurity in the atmosphere in contact with the semiconductive body. The present process minimizes this dependency of reproducibility on vapor pressure, and accordingly the reproducibility of the present process is enhanced over the prior art process. By utilizing the preferred embodiment of the present invention, reproducibilities as low as ±2 percent are obtained.

The present invention consists of three steps, the first of which is a vapor-solid diffusion step. A significant impurity source is heated causing the source to vaporize, and the vapor so formed is transported to the surface of the semiconductive body. The conditions under which the diffusion takes place are chosen to favor the formation of a layer of glass on the surface of the silicon body. The diffusion is continued for a prescribed period at a prescribed temperature to produce a discrete layer within the silicon in which the significant impurity predominates. In a preferred embodiment, in which reproducibility is enhanced, a substantial excess of significant impurity is introduced into the atmosphere in contact with the silicon body.

In accordance with the second step of the present process, the semiconductive body is treated with an etchant to remove the glass formed during the prior diffusion step. An etchant is used which dissolves the glass layer and leaves the silicon surface and diffused layer within the silicon untouched.

The third step in the process, termed hereinafter as the "spreading step" consists of heating the silicon body containing the diffused layer to a prescribed temperature and maintaining it at such temperature for a prescribed time. During this step the layer of significant impurity produced in the diffusion step is increased in depth by diffusion into the interior of the silicon body.

An unusual result has been observed in conjunction with the practice of the preferred embodiment described above in which an excess of significant impurity is employed in the vapor.

The concentration of significant impurity in the surface of the silicon, measured after the removal of the glass layer, is found to be a constant which is substantially independent of the vapor pressure of the significant impurity and also of the temperature of the silicon. For example, using boron trioxide ($B_2O_3$) as the source, the concentration of boron in the surface of the silicon after the diffusion step is approximately $4\times10^{20}$ atoms of boron per cubic centimeter over a range of source and silicon temperatures from 700° C. to 1300° C. It is believed that this substantially constant concentration is an important factor in the high reproducibility obtained by the practice of this invention.

The invention will be better understood from the following more detailed description, taken in conjunction with the accompanying drawings in which.

Figure 1:
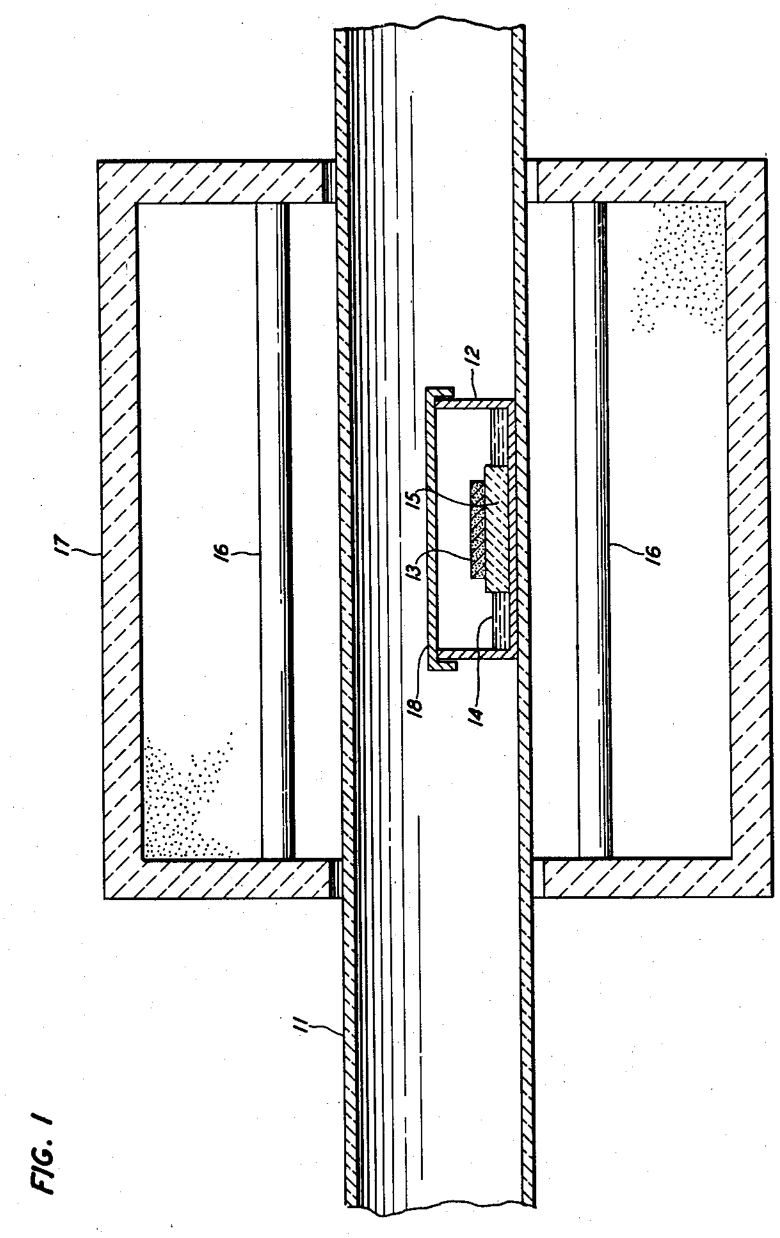
FIG. 1 is a schematic view of one apparatus suitable for the practice of the diffusion step of the present invention.

With reference now more particularly to the drawings, FIG. 1 depicts one type of apparatus which is suitable for producing a diffused layer in a silicon body in accordance with the present invention. FIG. 1 shows an elongated fused silica furnace tube 11, in which is placed covered box 12 containing the silicon body 13 to be treated and the significant impurity source 14. As has been indicated above, a preferred embodiment of the present invention necessitates the use of an excess vapor pressure of the significant impurity in the atmosphere in contact with the semiconductive body. One convenient method of obtaining such an excess is to utilize a box 12 as shown in FIG. 1.

The box 12 is necessarily composed of a heat-resistant material is unaffected by the atmospheres used in the process. The material should also be innocuous with respect to the diffusion process in that it should not introduce impurities into the atmosphere. The box 12 is not completely air tight, a loose-fitting cover 18 being employed, and accordingly there is a continual interchange between the atmosphere inside and outside of box 12. As can be seen from FIG. 1, the significant impurity source material 14 is conveniently placed on the bottom of the box 12. Platform 15, composed of a material unaffected by the heat and innocuous with respect to the diffusion step, is used to separate the body 13 from contact with the source material 14. Typical materials suitable for the box and platform are a ceramic such as fused alumina or a noble metal such as platinum.

Heating rods 16 are used to maintain the source 14 and the body 13 at the proper temperature levels. An atmosphere gas is introduced into the left end of furnace tube 11 and flows past box 12 where it is partly interchanged with the atmosphere inside box 12. Tube 11 is insulated with asbestos 17 or other suitable insulating material.

Figure 2:
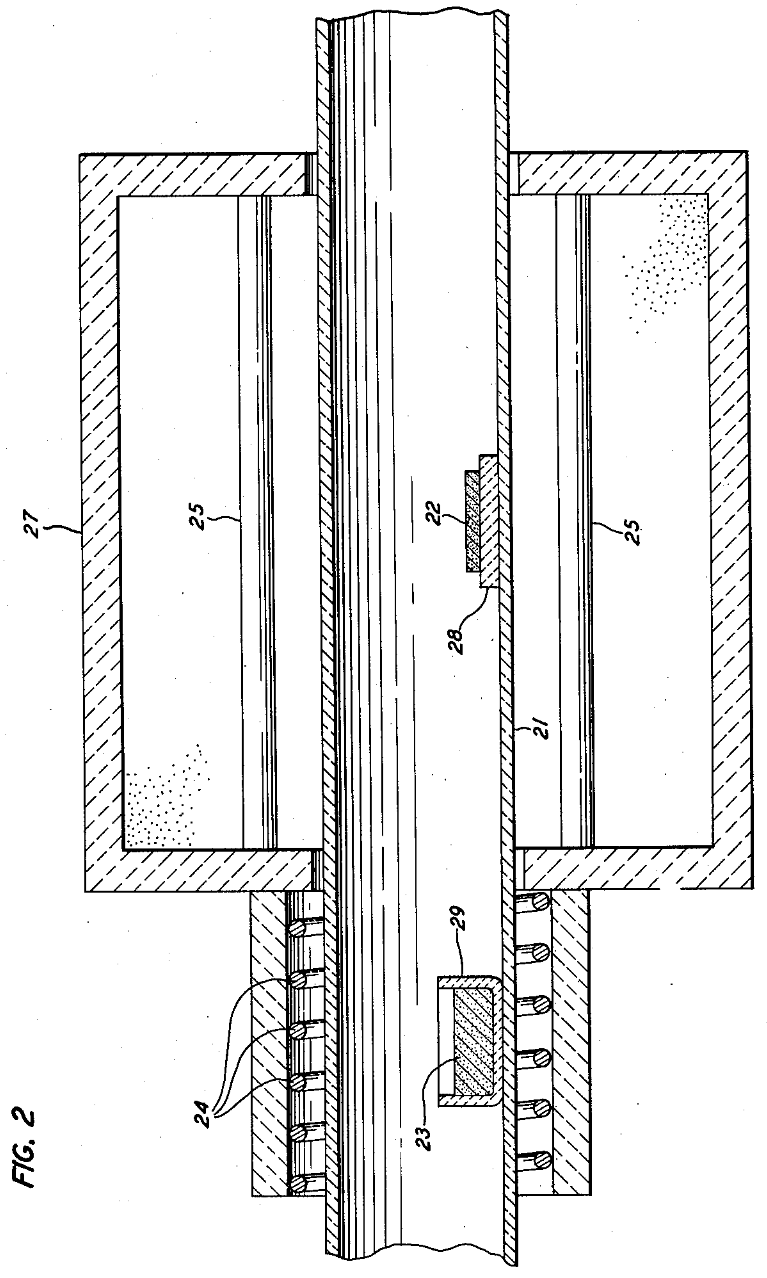
FIG. 2 is a schematic view of a second apparatus suitable for the practice of the diffusion step of the present invention.

FIG. 2 depicts a second type of apparatus suitable for use in the present invention. In FIG. 2 can be seen an elongated fused silica furnace tube 21 in which are situated silicon body 22 on support 28, and container 29 holding source 23. Coils 24 are utilized to maintain source 23 at the desired temperature, and heater rods 25 are employed to maintain body 22 at the required temperature. An atmosphere gas is introduced into the left end of tube 21, and flows past source 23 at which point the significant impurity vapor mixes with the gas. The combined atmosphere then contacts body 22. Tube 21 is insulated with asbestos 27 or other suitable insulating material.

Figure 3:
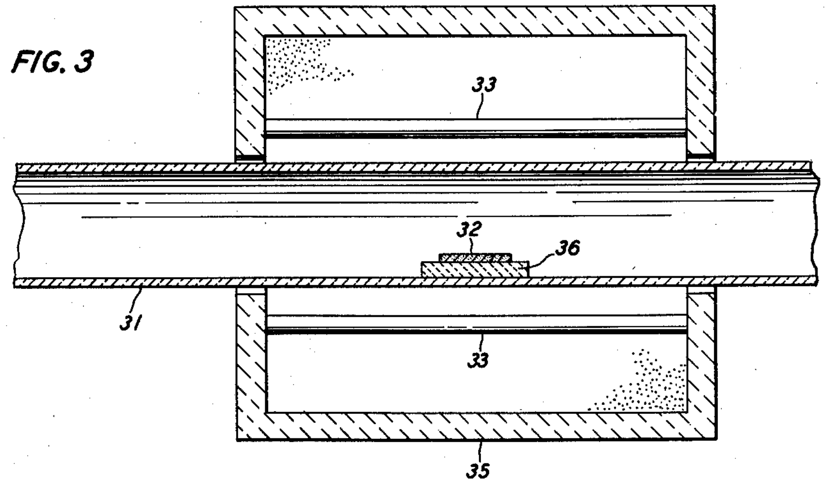
FIG. 3 is a schematic view of an apparatus suitable for the practice of the spreading step of the present invention.

FIG. 3 depicts an apparatus which is suitable for the spreading step of the present invention. Shown in FIG. 3 is a fused silica furnace tube 31 insulated with asbestos 35 or other insulating material. Silicon body 32, which is placed in tube 31 and disposed on support 36, is heated to the desired temperature level by heater rods 33. An atmosphere gas is introduced into the left end of tube 31.

Figure 4A:
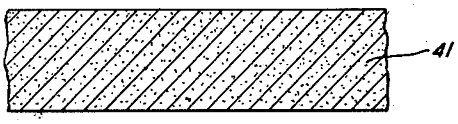
FIGS. 4A through 4D are sectional views of a broken portion of a silicon body which depict four successive stages in the production of a layer of converted conductivity type in accordance with the present invention.

FIGS. 4A through 4D show a portion of a silicon body in various stages during the production of a converted layer in accordance with the present invention. FIG. 4A shows a body 41 of silicon of one conductivity type. In accordance with the first step of the present process, the diffusion step, body 41 is placed in an apparatus similar to that shown in either FIG. 1 or FIG. 2, and there exposed to an atmosphere containing a significant impurity of the type opposite to that which predominates in the body for a prescribed period of time at an elevated temperature. Any of the known significant impurities which have been found suitable for use in vapor-solid diffusion processes of the prior art can be employed in the present invention provided such impurities are capable of forming a glass with silicon. Boron, phosphorus, and antimony have proven to be suitable in this respect.

Figure 4B:
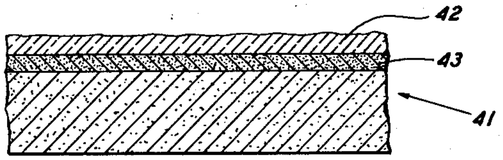

The resultant body from the diffusion step is shown in FIG. 4B. A layer 43 in which the significant impurity utilized in the diffusion step predominates and a layer of glass 42 are formed as shown in FIG. 4B. Although FIG. 4B is a broken section, it is to be understood that the diffusion occurs at all exposed surfaces of the body 41. When boron trioxide ($B_2O_3$) is used as the source, for example, glass layer 42 is believed to be a mixture of silicon dioxide, boron trioxide, silicon, and boron.

Figure 4C:
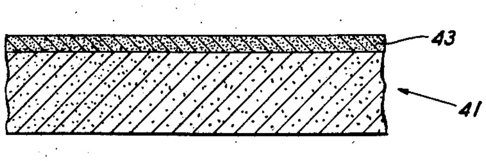
Figure 4D:
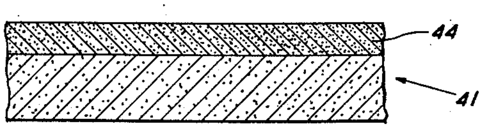

FIG. 4C depicts body 41 after the removal of the glass 42, which removal is accomplished by treating the body 41 with an etchant which dissolves the glass and leaves the silicon untouched. A convenient etchant for this purpose is hydrofluoric acid, although any etchant which differentiates in its etching action between silicon and the glass is satisfactory. Body 41 is now ready for the final step of the inventive process.

The last step in the present process, the spreading step, is accomplished by heating the body 41 including converted layer 43 to a prescribed temperature for a predetermined period of time. The result of this spreading step can be seen in FIG. 4D. The amount of spreading is directly proportional to the time and temperature used. Since no further significant impurity is added in this last step, it is apparent that as the converted layer increases in depth the concentration of significant impurity of that portion which represents the original converted layer 43 decreases.

As an illustrative example, a diffusion step in accordance with this invention utilizing boron as the significant impurity is described in terms of the apparatus shown in FIG. 1. The silicon body 13 to be treated is first etched and polished in the conventional manner to produce a smooth, uninterrupted surface. As an alternative, the polished silicon body may be exposed to an oxidizing atmosphere at an elevated temperature to produce a thin oxide layer on the surface. (See United States Patent 2,802,760.)

A box 12, as shown in FIG. 1, is employed to hold the silicon body 13 and the source material 14. The source material 14, for example, boron trioxide ($B_2O_3$), is placed in the bottom of the box 12 and the silicon body 13 is placed upon platform 15, as shown in FIG. 1. As discussed above, use of the box 12, design of which is not critical, is exemplary of the preferred embodiment of this invention. The box 12, by restricting the volume in which the source material vaporizes and by substantially decreasing the dilution effect produced by the flow of the atmosphere gas through the furnace tube, conveniently provides an excess of significant impurity in the atmosphere in contact with body 13.

The diffusion step may be conducted at a temperature in the range of 700° C. to 1300° C., the use of the box causing the source 14 and the silicon 13 to be maintained at essentially the same temperature. The minimum and maximum temperatures in this example are based on considerations relating to the silicon body. At temperatures below 700° C., diffusion of the significant impurity is too slow from a standpoint of practicability, and at temperatures above 1300° C. pitting of the silicon may occur. In instances of use of other impurities, although the maximum temperature of 1300° C. prevails, the minimum may be increased due to the low vapor pressure of the impurity source employed.

At temperatures below approximately 1150° C., the atmosphere gas may be any inert gas such as nitrogen, argon or helium. At temperatures above approximately 1150° C., it has been found desirable to introduce oxygen into the atmosphere to prevent pitting of the surface of the silicon.

It has been found that at temperatures above approximately 1100° C. a dark deposit occasionally results on the surface of the diffused silicon body. This has been attributed to too high a vapor pressure of boron trioxide. However, this deposit is easily removed by etchants such as nitric acid and sulfuric acid, and has not been found to either affect the reproducibility of the process or have any other deleterious effect.

To prevent the dark deposit from forming a mixture of boron trioxide ($B_2O_3$) and silicon dioxide, which has a lower vapor pressure than pure boron trioxide, may be used as the source material at the higher temperatures. In particular, a mixture of equal parts by weight of boron trioxide and silicon dioxide has been found convenient for this purpose. This mixture, which has a melting point of approximately 940° C., may be used satisfactorily over the temperature range from approximately 950° C. to 1300° C. Reproducibility is not affected by the use of such a diluted source material.

Another illustrative example of a diffusion step in accordance with the present invention is described in terms of FIG. 2, with phosphorous pentoxide ($P_2O_5$) as the significant impurity source 23. This diffusion differs from the boron diffusion described above in that the source material 23 and the silicon body 22 are maintained at different temperatures during the diffusion process. The silicon body 22 is etched and polished in the conventional manner prior to the diffusion step to produce a smooth, uninterrupted surface. Alternatively, the polished silicon body may be preoxidized to form a thin oxide layer on the surface. The silicon body 22 may be maintained at a temperature in the range of 700° C. to 1300° C. for the reasons specified above with respect to the boron diffusion.

For the practice of the preferred embodiment, it has been determined that the minimum phosphorous pentoxide temperature is about 275° C., a preferred range being from 275° to 330° C. Temperatures below 275° C are suitable although reproducibility is diminished.

The atmosphere introduced into the fused silica tube may be an inert gas such as nitrogen, argon or helium. However, an atmosphere containing oxygen is preferred for diffusions at the higher silicon temperatures to ensure against pitting of the silicon body.

As indicated above, a prime prerequisite of a significant impurity suitable for use in the diffusion step of this invention is that it be capable of forming a glass with silicon. In the illustrations described above, the significant impurity sources consisted of oxides of the significant impurity elements. Although the mechanism is not fully understood, it is known that the use of such oxides results in the formation of a glass on the surface of the silicon body regardless of the composition of the atmosphere used and irrespective of whether a preoxidized silicon body is employed. If neither a preoxidized silicon body nor an oxide form of significant impurity source are used, an oxidizing atmosphere is necessary for the formation of a glass. Alternatively, if neither an oxide form of significant impurity nor an oxidizing atmosphere is used, the silicon body must be preoxidized to permit the formation of the glass.

The spreading step is conveniently conducted in an apparatus similar to that shown in FIG. 3. To prevent pitting of the silicon the atmosphere gas is preferably pure oxygen or a combination of oxygen and an inert gas such as nitrogen.

In general, the spreading step is conducted at a temperature in the range of 700° C. to 1350° C. The lower limit is controlled by practical considerations since diffusion of significant impurities proceeds at a very slow rate at temperatures below 700° C. Consideration of the melting point of silicon dictates the upper limit of 1350° C. The preferred range of temperature is 1100° C. to 1300° C. and is advantageous in that shorter times are required.

The success of the present invention from the standpoint of reproducibility is predicated to a large extent on the formation of a layer of glass on the surface of the silicon during the diffusion step and the removal of this glass prior to the spreading step. It is hypothesized that reproducibility is enhanced due to the fact that the introduction of the significant impurity proceeds more uniformly between the glass phase and the silicon than would be the case in conventional vapor-solid diffusion processes in which the significant impurity enters the silicon directly from the vapor phase.

As indicated above, the preferred embodiment of this invention is practiced utilizing an excess vapor pressure of significant impurity during the diffusion step. In prior art processes, the concentration of significant impurity in a layer formed by a vapor-solid diffusion process was controlled by controlling the vapor pressure of significant impurity in the atmosphere in contact with the semiconductive body. In accordance with such processes, increasing or decreasing the vapor pressure of significant impurity, the concentration of significant impurity in the surface of the semiconductive body correspondingly is increased or decreased. In accordance with the teaching of this invention, it has been determined that an upper limit of vapor pressure exists beyond which a further increase in vapor pressure does not produce a corresponding increase in surface concentration. In other words, above a certain vapor pressure the surface concentration produced is constant and independent of the actual vapor pressure of significant impurity.

The preferred embodiment of this invention is practiced utilizing vapor pressures in the range in which the surface concentration is independent of vapor pressure. This unforeseeable independence of surface concentration with respect to the vapor pressure of significant impurity has been observed only when there is a glass layer formed on the surface of the silicon body in accordance with the teachings of this invention.

Listed below, in tabular form, are data obtained from typical examples of the practice of the preferred embodiment of this invention. Table 1 shows the sheet resistivity of 16 diffused silicon bodies which were produced in four separate runs, four bodies per run. The table indicates the sheet resistivity in such manner that those from any one run may be compared with each other and also resistivities obtained from the other runs.

*Table 1*

| | Silicon Body | Sheet Resistivity (ohms/square) | Reproducibility, percent |
|---|---|---|---|
| Example 1 | A | 2.11 | ±4 |
| | B | 2.03 | |
| | C | 2.04 | |
| | D | 2.08 | |
| Example 2 | A | 2.12 | ±4 |
| | B | 2.16 | |
| | C | 2.19 | |
| | D | 2.14 | |
| Example 3 | A | 2.12 | ±2 |
| | B | 2.14 | |
| | C | 2.14 | |
| | D | 2.10 | |
| Example 4 | A | 2.14 | ±2 |
| | B | 2.10 | |
| | C | 2.12 | |
| | D | 2.11 | |

The experimental procedure employed in each of the four runs listed as Examples 1 through 4 in Table 1 follows. Four silicon bodies, 10 mils thick and one-quarter of an inch square, having a resistivity of 0.4 ohm-centimeters, and being of n-type conductivity, were mechanically polished and cleaned in the conventional manner. The four bodies, together with a source material of boron trioxide, were then placed in a box similar to that shown in FIG. 1. The diffusion step in accordance with the present invention employing an apparatus similar to that shown in FIG. 1, was conducted for a period of 60 minutes at a temperature of 1154° C., utilizing nitrogen as the atmosphere gas. The resultant diffused bodies were etched in concentrated hydrochloric acid to remove the glass layer formed during the diffusion process. The four silicon bodies were next placed in an apparatus similar to that shown in FIG. 3 and maintained at a temperature of 1300° C. for a period of three hours.

As noted in Table 1, the reproducibility within a particular run varies from ±2 percent to ±4 percent, such reproducibility being calculated by dividing the difference between the highest and lowest sheet resistivity within a particular run by the average resistivity of the run. The sheet resistivities listed in Table 1 also indicate good agreement as between run to run.

Table 2 lists the measurements of sheet resistivity of 16 diffused silicon bodies produced in accordance with this invention, employing phosphorus pentoxide as the source material.

*Table 2*

| | Silicon Body | Sheet Resistivity (ohms/square) | Reproducibility, percent |
|---|---|---|---|
| Example 5 | A | .168 | ±2 |
| | B | .169 | |
| | C | .171 | |
| | D | .169 | |
| Example 6 | A | .159 | ±5 |
| | B | .155 | |
| | C | .159 | |
| | D | .164 | |
| Example 7 | A | .169 | ±1 |
| | B | .169 | |
| | C | .169 | |
| | D | .171 | |
| Example 8 | A | .169 | ±2 |
| | B | .169 | |
| | C | .172 | |
| | D | .171 | |

An apparatus similar to that shown in FIG. 2 was employed in accordance with this invention for the diffusion step in the production of the samples whose measurements are listed in Table 2. The silicon bodies which were of p-type conductivity and of a resistivity of approximately 0.2 ohm-centimeter, were maintained at a temperature of 1250° C. for a period of 40 minutes. The temperature of the phosphorus pentoxide source was 285° C. and oxygen was used as the atmosphere gas. After removal of the glass layer which was formed during the diffusion step, the bodies were treated in an apparatus similar to that shown in FIG. 3 at a temperature of 1300° C. for a period of three hours, oxygen being used as the atmosphere gas.

As may be seen from Table 2, the reproducibility within each particular run ranges from ±1 percent to ±5 percent. Additionally, the agreement between sheet resistivity from run to run is within narrow tolerances.

Table 3 shows the reproducibility of the present invention in a process employing antimony as the significant impurity. The sheet resistivities of two runs of four silicon bodies each is tabulated. As is shown by the resistivities listed, the agreement within either run is approximately ±6 percent.

The same general procedure as was used in the runs employing boron trioxide was used to produce the diffused layers whose characteristics appear in Table 3. The silicon bodies which were of p-type conductivity and of a resistivity of approximately two-tenths of an ohm-centimeter, together with a significant impurity source which consisted of equal parts by weight of antimony trioxide ($Sb_2O_3$) and silicon dioxide, were placed in a box similar to that shown in FIG. 1. The source and silicon bodies were maintained at a temperature of 1113° C. for a period of 30 minutes, nitrogen being employed as the atmosphere gas. After removal of the glass layer, the silicon bodies were treated in an apparatus similar to that shown in FIG. 3 at a temperature of 1300° C. for a period of three hours, oxygen being employed as the atmosphere gas.

*Table 3*

| | Silicon Body | Sheet Resistivity (ohms/square) |
|---|---|---|
| Example 9 | A | 51.8 |
| | B | 51.5 |
| | C | 53.0 |
| | D | 54.5 |
| Example 10 | A | 51.9 |
| | B | 50.7 |
| | C | 53.8 |
| | D | 54.5 |

Table 4 lists the breakdown voltages of eleven diodes made from one silicon body treated in accordance with this invention. The silicon body from which the diodes were made was of n-type conductivity and of resistivity of one ohm-centimeter. A p-type layer was produced in the body in accordance with the present invention utilizing boron as the significant impurity. The experimental procedure was similar to that used to obtain the data shown in Table 1, although in this instance the source material consisted of equal parts by weight of boron trioxide and silicon dioxide. The diffusion step was conducted at a temperature of 1200° C. for a period of one hour employing oxygen as the atmosphere gas. After the removal of the glass layer the silicon body was maintained at 1300° C. for a period of three hours. The resultant body was treated in the conventional manner to produce eleven diodes whose breakdown voltages are listed in Table 4.

*Table 4*

| | Diode | Breakdown Voltage (volts) |
|---|---|---|
| Example 11 | A | 85 |
| | B | 85 |
| | C | 85 |
| | D | 85 |
| | E | 84 |
| | F | 85 |
| | G | 85 |
| | H | 84 |
| | I | 84 |
| | J | 85 |
| | K | 84 |

As can be seen, the breakdown voltages listed in Table 4 show excellent agreement. These data are an indication of the uniformity of a diffused layer produced in accordance with this invention.

Table 5 is a tabulation of breakdown voltages of diodes produced in accordance with the present invention. Examples 12, 13 and 14 represent three separate runs, the runs of Examples 12 and 13 consisting of four silicon bodies per run and the run of Example 14 consisting of three silicon bodies.

*Table 5*

| | Silicon Body | Breakdown Voltage (Volts) |
|---|---|---|
| Example 12 | A | 135 |
| | B | 132 |
| | C | 132 |
| | D | 135 |
| Example 13 | A | 132 |
| | B | 126 |
| | C | 130 |
| | D | 132 |
| Example 14 | A | 125 |
| | B | 131 |
| | C | 128 |

The experimental procedure was similar to that used to obtain the data shown in Table 4 with the exception that the diffusion step was conducted at 1300° C. for a period of 30 minutes.

As may be seen from a comparison of the breakdown voltages tabulated, good reproducibility was obtained within each run and from run to run. The data in Table 5, taken in conjunction with the data of Table 4, indicate the good reproducibility of devices produced in accordance with the present invention.

A further advantage of the preferred embodiment, resulting in large measure from the fact that the surface concentration in the diffused body remains constant, is that tables may be prepared which permit precalculation of the proper temperatures and times for the diffusion and spreading steps to obtain a desired final result. Since the quantity of significant impurity in the converted layer after the diffusion step is proportional to the depth of such layer, fixing the number of molecules of significant impurity which are required in the final layer after spreading will control the choice of depth of the converted layer produced during the diffusion step. Such depth may be obtained by any convenient combination of time and temperature since the distribution for any specific depth is independent of these parameters.

The spreading step is essentially a redistribution of the molecules of the significant impurity present in the layer formed during the diffusion step. In the spreading step, as the depth increases, the surface concentration decreases, the relationship between these variables being well known. Thus, charts may be prepared which relate the parameters of time and temperatures which are necessary in the diffusion and spreading steps to accomplish a desired end result.

Although the illustrative examples and tables of data set forth above relate to the use of phosphorous, boron, and antimony, it is to be understood that the present invention is not limited to the use of these particular significant impurities. On the contrary, it is considered that the present invention consists of a succession of manipulative steps, which if performed under the described conditions produces results which are highly reproducible. Accordingly, the desired process may be varied or modified by one skilled in the art without departing from the spirit and scope of the invention.

What is claimed is:

1. The process of diffusion of phosphorus atoms into at least one surface of a silicon slice which comprises the steps of prediffusing phosphorus into said surface at a temperature which causes the phosphorus impurities to diffuse into the slice, etching said prediffused surface to remove all loose phosphorus and phosphorus glass leaving the impurities diffused into the slice, and subsequently subjecting the slice to a temperature of about 1300° C. in the absence of further impurities whereby the diffused phosphorus layer diffuses further into the material to form a diffusion layer of desired depth and impurity concentration.

2. The process of diffusion of phosphorus atoms into at least one surface of a silicon slice which comprises the steps of prediffusing phosphorus into said surface at a temperature which causes the phosphorus impurities to diffuse into the slice, etching said prediffused surface to remove all loose phosphorus and phosphorus glass leaving the impurities diffused into the slice, and subsequently subjecting the slice to a temperature in the range of 700–1350° C. in the absence of further impurities whereby the diffused phosphorus layer diffuses further into the material to form a diffusion layer of desired depth and impurity concentration.

3. The method of claim 2 in which the significant impurity in the vapor state is produced by heating a source material including phosphorus pentoxide.

4. The process of claim 2 wherein the prediffusion step comprises contacting the silicon surface with an atmosphere containing phosphorus in the vapor state, said atmosphere having a vapor pressure of phosphorus which is at least the value beyond which the concentration of phosphorus in the surface of the said silicon body is independent of further increases in vapor pressure whereby a layer of glass is produced on the surface of said body and whereby the prediffused layer of phosphorus is obtained in said body.

5. The process of diffusion of boron atoms into at least one surface of a silicon slice which comprises the steps of prediffusing boron into said surface at a temperature which causes the boron impurities to diffuse into the slice, etching said prediffused surface to remove all loose boron and boron glass leaving the impurities diffused into the slice, and subsequently subjecting the slice to a temperature in the range of 700–1350° C. in the absence of further impurities whereby the diffused boron layer diffuses further into the material to form a diffusion layer of desired depth and impurity concentration.

6. The process of claim 5 wherein the prediffusion step comprises contacting the silicon surface with an atmosphere containing boron in the vapor state, said atmosphere having a vapor pressure of boron which is at least the value beyond which the concentration of boron in the surface of the said silicon body is independent of further increases in vapor pressure whereby a layer of glass is produced on the surface of said body and whereby the prediffused layer of boron is obtained in said body.

7. The method of claim 5 in which the significant impurity in the vapor state is produced by heating a source material including boron trioxide.

8. The method of claim 7 in which the source material and the silicon body are enclosed in a confined space the atmosphere in which is continually interchanged with that outside.

9. The process of diffusion of antimony atoms into at least one surface of a silicon slice which comprises the steps of prediffusing antimony into said surface at a temperature which causes the antimony impurities to diffuse into the slice, etching said prediffused surface to remove all loose antimony and antimony glass leaving the impurities diffused into the slice, and subsequently subjecting the slice to a temperature in the range of 700–1350° C. in the absence of further impurities whereby the diffused antimony layer diffuses further into the material to form a diffusion layer of desired depth and impurity concentration.

10. The method of claim 9 in which the significant impurity in the vapor state is produced by heating a source material including antimony trioxide.

11. The process of claim 9 wherein the prediffusion step comprises contacting the silicon surface with an atmosphere containing antimony in the vapor state, said atmosphere having a vapor pressure of antimony which is at least the value beyond which the concentration of antimony in the surface of the said silicon body is independent of further increases in vapor pressure whereby a layer of glass is produced on the surface of said body and whereby the prediffused layer of antimony is obtained in said body.

References Cited in the file of this patent

UNITED STATES PATENTS 2,802,760 Derick et al. ------------ Aug. 13, 1957